(12) United States Patent
Hamamoto (10) Patent No.: US 7,095,064 B2
(45) Date of Patent: Aug. 22, 2006

(54) SEMICONDUCTOR SENSOR WITH PRESSURE DIFFERENCE ADJUSTING MEANS

(75) Inventor: Kazuaki Hamamoto, Nagoya (JP)

(73) Assignee: Denso Corporation, Kariya (JP)

( * ) Notice: Subject to any disclaimer, the term of this patent is extended or adjusted under 35 U.S.C. 154(b) by 64 days.

(21) Appl. No.: 10/809,343

(22) Filed: Mar. 26, 2004

(65) Prior Publication Data

US 2004/0188784 A1 Sep. 30, 2004

(30) Foreign Application Priority Data

Mar. 31, 2003 (JP) ............................. 2003-096376

(51) Int. Cl.
*H01L 29/82* (2006.01)
(52) U.S. Cl. .................... 257/254; 257/415; 73/204.26
(58) Field of Classification Search ................ 257/254, 257/415; 73/204.26
See application file for complete search history.

(56) References Cited

U.S. PATENT DOCUMENTS 5,581,028 A * 12/1996 Barth et al. .............. 73/204.26

6,150,681 A 11/2000 Allen

FOREIGN PATENT DOCUMENTS

| JP | A S59-137835 | 8/1984 |
| JP | A-H06-129898 | 5/1994 |
| JP | A-H07-58134  | 3/1995 |
| JP | A-H07-120306 | 5/1995 |

\* cited by examiner

*Primary Examiner*—Thomas L. Dickey
(74) *Attorney, Agent, or Firm*—Posz Law Group, PLC (57) ABSTRACT

In a semiconductor sensor having a membrane structure, the destruction of the membrane caused by the expansion or contraction of a fluid within a hollow part formed under the membrane while the sensor is in use is prevented. A semiconductor sensor 10 comprising a substrate 30 and a membrane 20 formed on the top surface thereof, in which the bottom of the substrate 30 and a mounting surface 50 on which the sensor 10 is mounted are bonded, has pressure difference adjusting means 22a to 22c for eliminating the difference in pressure of a fluid between an inside and an outside of a hollow part 34 while the sensor is in use.

13 Claims, 10 Drawing Sheets

SEMICONDUCTOR SENSOR WITH PRESSURE DIFFERENCE ADJUSTING MEANS

BACKGROUND OF THE INVENTION

1. Field of the Invention

The present invention relates to a semiconductor sensor, such as an infrared-ray sensor, a gas sensor, an air fuel ratio sensor, a pressure sensor and an acceleration sensor, having a membrane structure.

2. Description of the Related Art

Figure 5A:
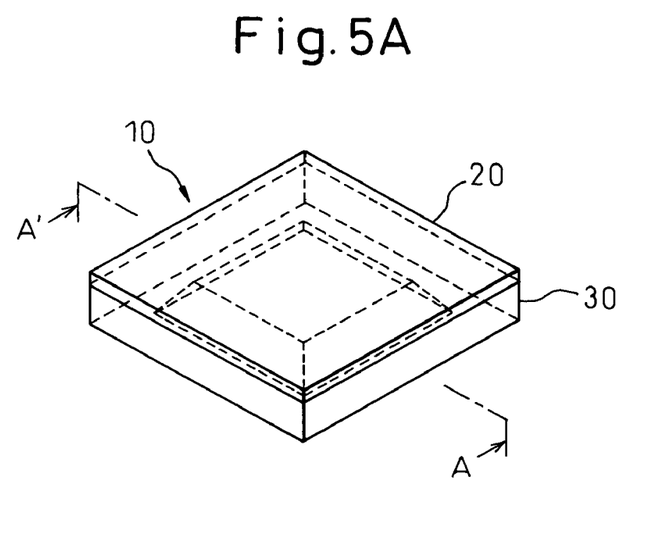
FIG. 5A is a perspective view of a conventional semiconductor sensor (No.1).
Figure 5B:
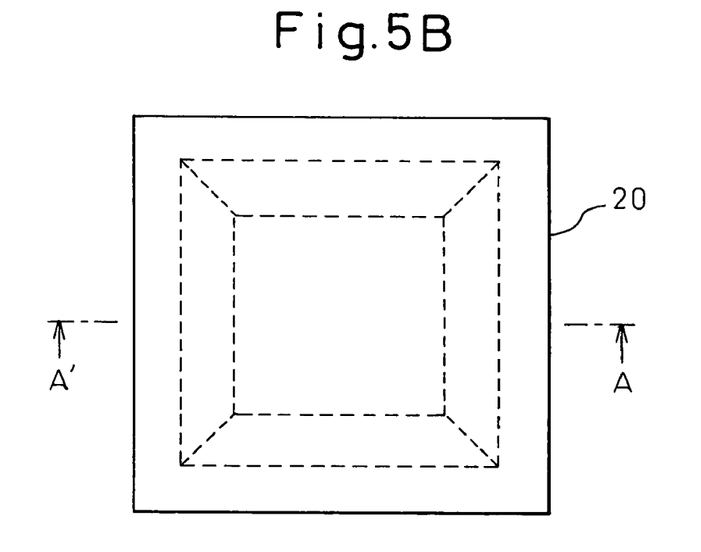
FIG. 5B is a top view of the conventional semiconductor sensor (No.1).
Figure 5C:
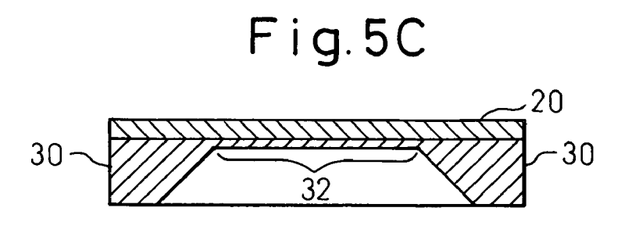
FIG. 5C is a sectional view along the A–A' line in FIG. 5A.
Figure 6A:
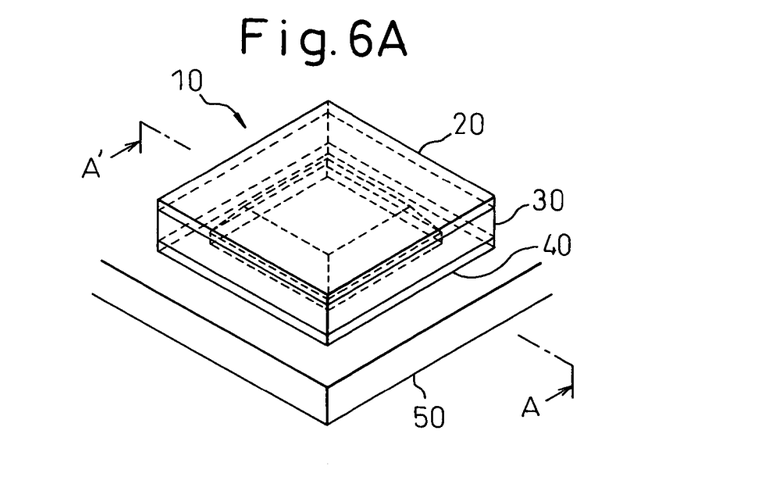
FIG. 6A is a perspective view of the semiconductor sensor (No.1) in FIG. 5 in a state of being assembled.
Figure 6B:
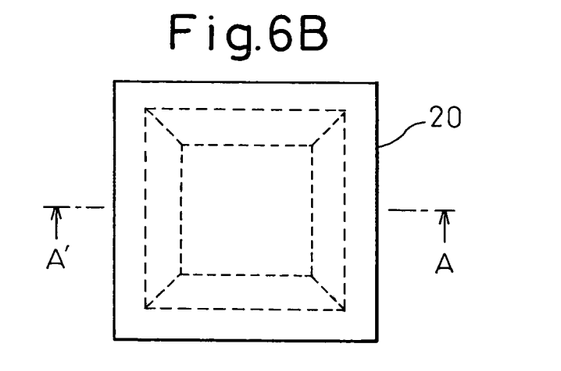
FIG. 6B is a top view of the semiconductor sensor (No.1).
Figure 6C:
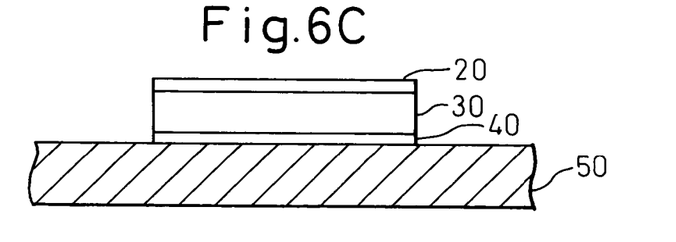
FIG. 6C is a side view of the semiconductor sensor (No.1).
Figure 6D:
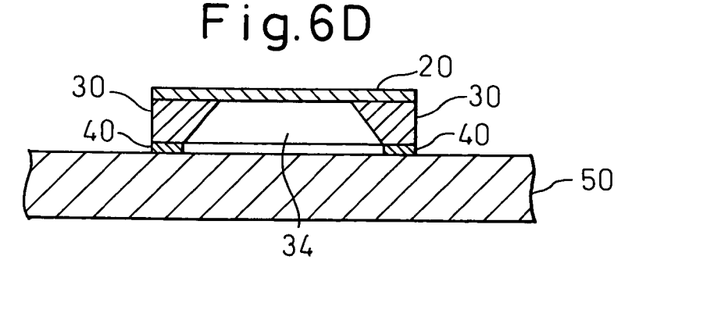
FIG. 6D is a sectional view along the A–A' line in FIG. 6A.

Conventionally, a semiconductor sensor having a so-called membrane structure is frequently used. A membrane (thin film) is formed, by etching, in the center of the undersurface of a wafer and a detecting element is formed on the membrane in order to increase the sensitivity of the sensor. FIG. 5A to FIG. 5C are illustrations showing a semiconductor sensor having a conventional membrane structure.

As shown in a perspective view in FIG. 5A, a semiconductor sensor 10 comprises an insulating material layer 20 and a substrate 30 made of silicon or the like for supporting the insulating material layer 20. As shown in a top view in FIG. 5B and in a sectional view along the A–A' line in FIG. 5C, the undersurface of the substrate 30 is etched in the center of the sensor to form a thin film part 32 and then a membrane is formed by the thin film part 32 and the insulating material layer 20. After this, a detecting element (not shown) for sensing is formed on the top surface of the membrane so that it has a plurality of layers.

FIG. 6A to FIG. 6D are each a perspective view, a top view, a side view and a sectional view along the A–A' line, respectively, showing a semiconductor sensor having a conventional membrane structure (membrane) in an assembled state. As shown schematically, the semiconductor sensor 10 is bonded to a mounting surface, such as a stem 50, with an adhesive 40. A sensor having such a membrane structure has been disclosed in, for example, Patent documents 1 to 3.

[Patent document 1]
Japanese Unexamined Patent Publication (Kokai) No. 7-58134 (paragraphs [0016] to [0020])
[Patent document 2]
Japanese Unexamined Patent Publication (Kokai) No. 6-129898 (paragraphs [0028] to [0038])
[Patent document 3]
Japanese Unexamined Patent Publication (Kokai) No. 7-120306 (paragraphs [0010] to [0024])

As shown in FIG. 6A to FIG. 6D, however, if the entire undersurface of the substrate 30 is bonded to the stem 50, a hollow part 34 under the membrane is sealed hermetically and a way of escape of a fluid, such as air, present inside the hollow part 34 is blocked. If the fluid expands or contracts within the hollow part 34 because of the change in temperature, a difference in pressure is produced between the inside and outside of the semiconductor sensor 10, an excessive stress is produced in the membrane, and deformation and distortion of the membrane occur.

Figure 7A:
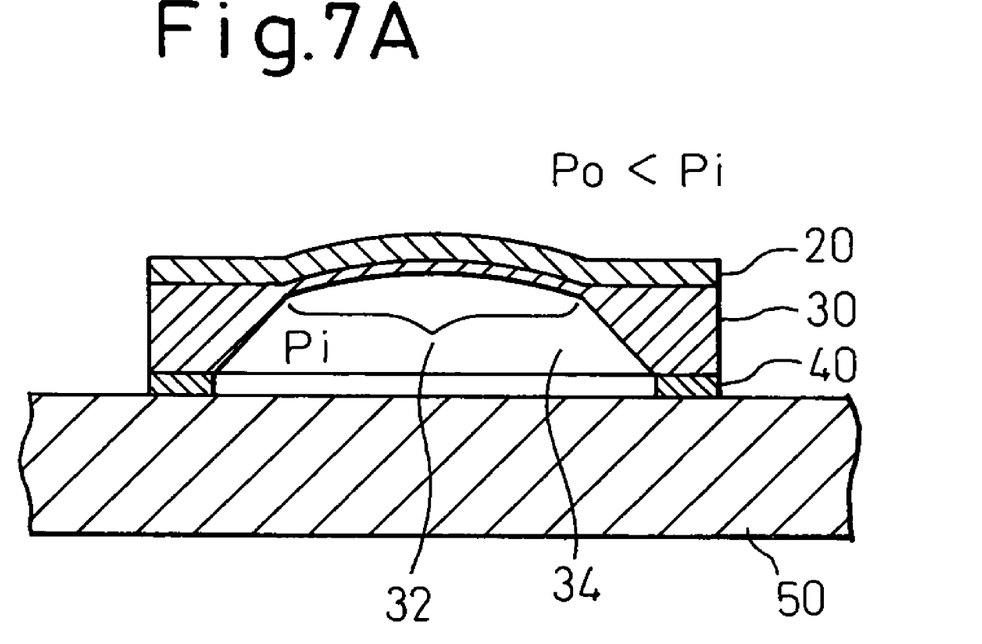
FIG. 7A is an illustration for explaining the deformation of a membrane caused by the expansion of a fluid within a hollow part under the membrane in the conventional semiconductor sensor.
Figure 7B:
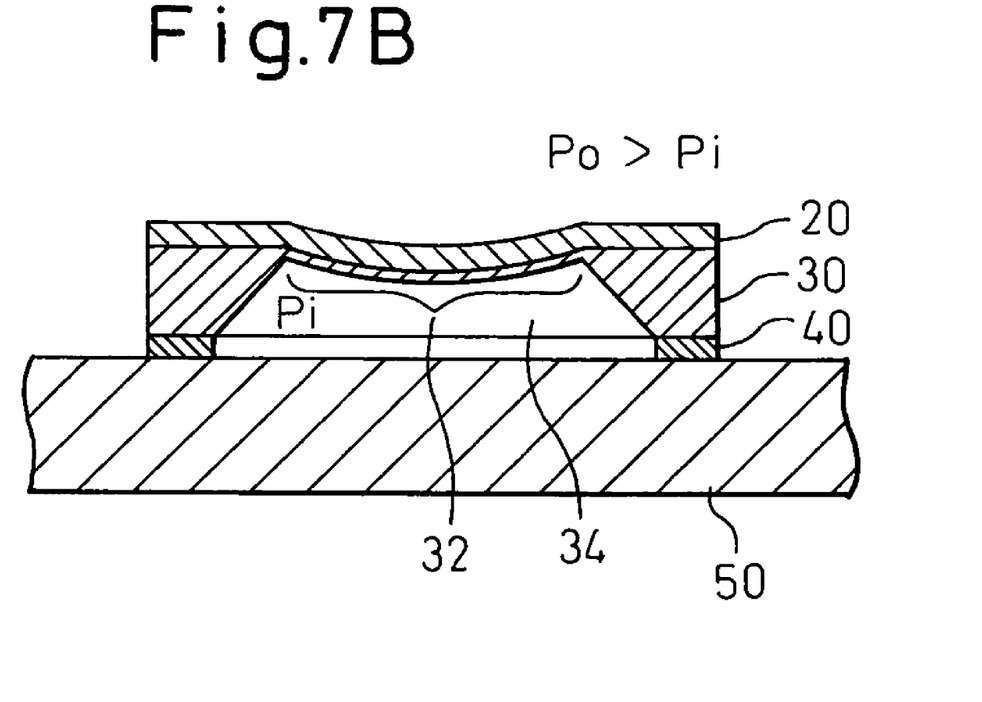
FIG. 7B is an illustration for explaining the deformation of a membrane caused by the contraction of a fluid within a hollow part under the membrane in the conventional semiconductor sensor.

In other words, as shown in FIG. 7A, when the fluid within the hollow part 34 expands, a gas pressure Pi inside the hollow part 34 becomes higher than a gas (atmospheric) pressure Po outside the hollow part 34, and the membrane made of the thin film part 32 and the insulating material layer 20 of the substrate 30 is deformed in such a way as to be pushed upward. In contrast to this, as the fluid within the hollow part 34 contracts, the gas pressure Pi inside the hollow part 34 becomes lower than the gas pressure Po outside the hollow part 34 and the membrane is deformed in such a way as to be pushed downward. If such deformation of the membrane is excessively large, there is a possibility of destruction of the membrane and if deformation of the membrane at a certain magnitude is repeated, there is a possibility of occurrence of fatigue failure of the membrane.

An example of a method for avoiding the above-mentioned problem is such one in which the bonding part of the bottom of the semiconductor sensor 10 to the stem is limited only to a part thereof (for example, refer to Patent document 1), as shown in FIG. 8A to FIG. 8D and FIG. 9A to FIG. 9E. FIG. 8A to FIG. 8D show how only opposite sides of the bottom of the semiconductor sensor 10 are bonded to the stem with adhesives 40a and 40b. FIG. 8A to FIG. 8D are each a perspective view, a top view, a side view in the X direction and a sectional view along the line A–A', respectively. FIG. 9A to FIG. 9E show how only four corners of the bottom of the semiconductor sensor 10 are bonded thereto with the adhesives 40a, 40b, 40c and 40d. FIG. 9A to FIG. 9E are each a perspective view, a top view, a side view in the X direction, a sectional view along the line A–A' and a sectional view along the line B–B', respectively.

Figure 8A:
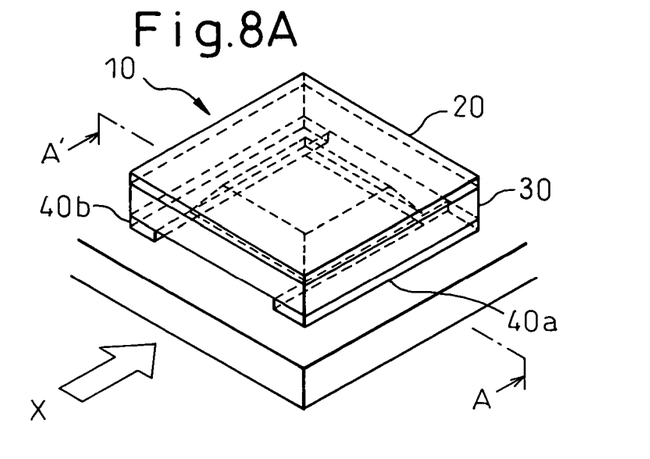
FIG. 8A is a perspective view of a conventional semiconductor sensor (No.2).
Figure 8B:
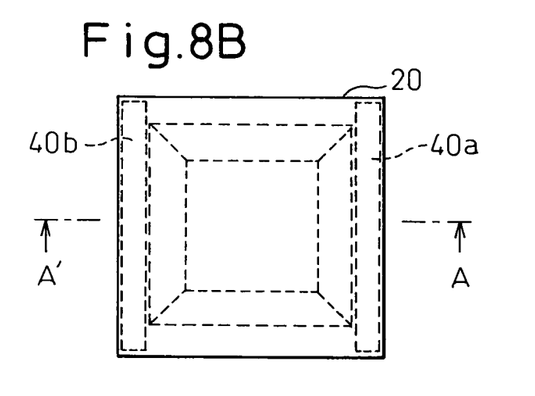
FIG. 8B is a top view of the conventional semiconductor sensor (No.2).
Figure 8C:
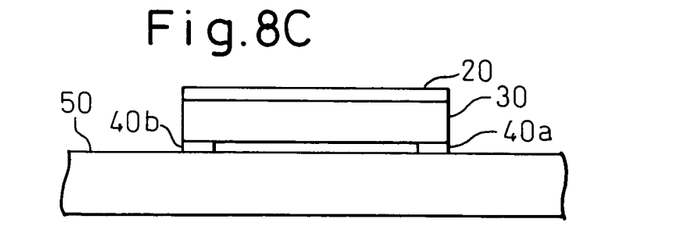
FIG. 8C is a side view of the conventional semiconductor sensor (No.2).
Figure 8D:
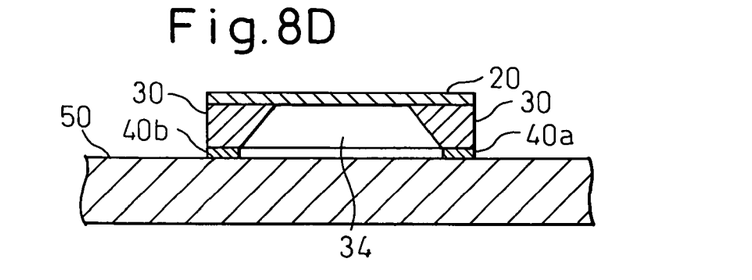
FIG. 8D is a sectional view along the A–A' line in FIG. 8A.
Figure 9A:
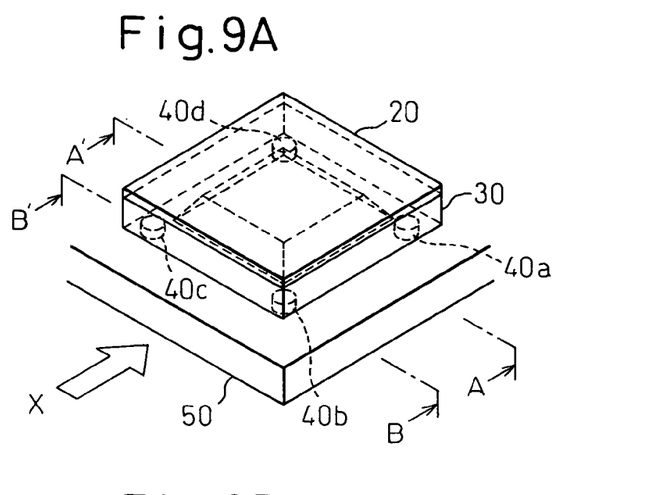
FIG. 9A is a perspective view of a conventional semiconductor sensor (No.3).
Figure 9B:
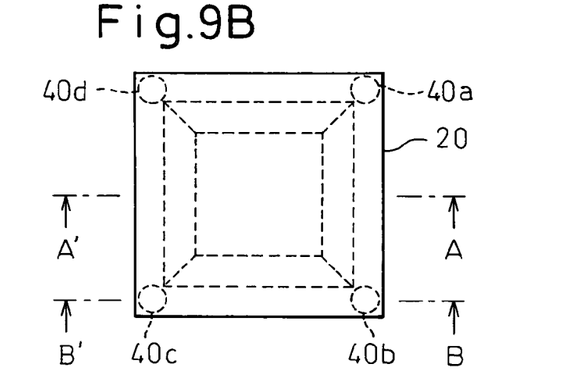
FIG. 9B is a top view of the conventional semiconductor sensor (No.3).
Figure 9C:
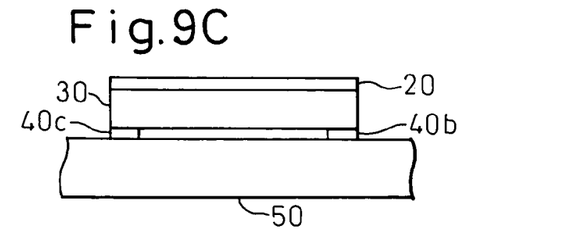
FIG. 9C is a side view of the conventional semiconductor sensor (No.3).
Figure 9D:
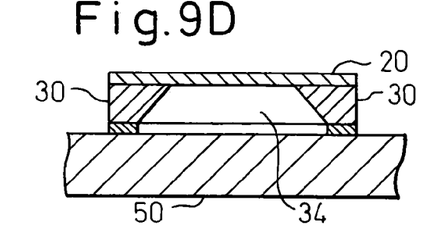
FIG. 9D is a sectional view along the A–A' line in FIG. 9A.
Figure 9E:
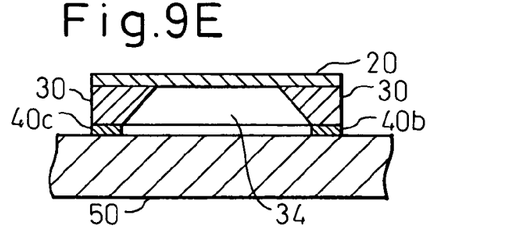
FIG. 9E is a sectional view along the B–B' line in FIG. 9A

By limiting the bonding part only to a part of the bottom as described above, the hollow part 34 under the membrane and the outside of the semiconductor sensor 10 are communicated with each other through the gaps at the parts not bonded, as shown in FIG. 8C and FIG. 8D and in FIG. 9D and FIG. 9E and, therefore, a difference in gas pressure between the inside and the outside of the semiconductor sensor 10 can be eliminated.

However, the use of this method causes a problem: it becomes difficult to control the quantity of adhesive 40 to be applied when the semiconductor sensor 10 is mounted on the stem 50 and the mounting process becomes complicated. In other words, if the quantity of adhesive 40 to be applied is too small, the bonding strength is reduced and if, in contrast to this, the quantity is too large, the adhesive invades even unwanted parts and the hollow part 34 is sealed because the entire circumference of the bottom of the substrate 30 is bonded with the invaded adhesive. Therefore, it is necessary to precisely control the quantity of adhesive to be applied.

Figure 10:
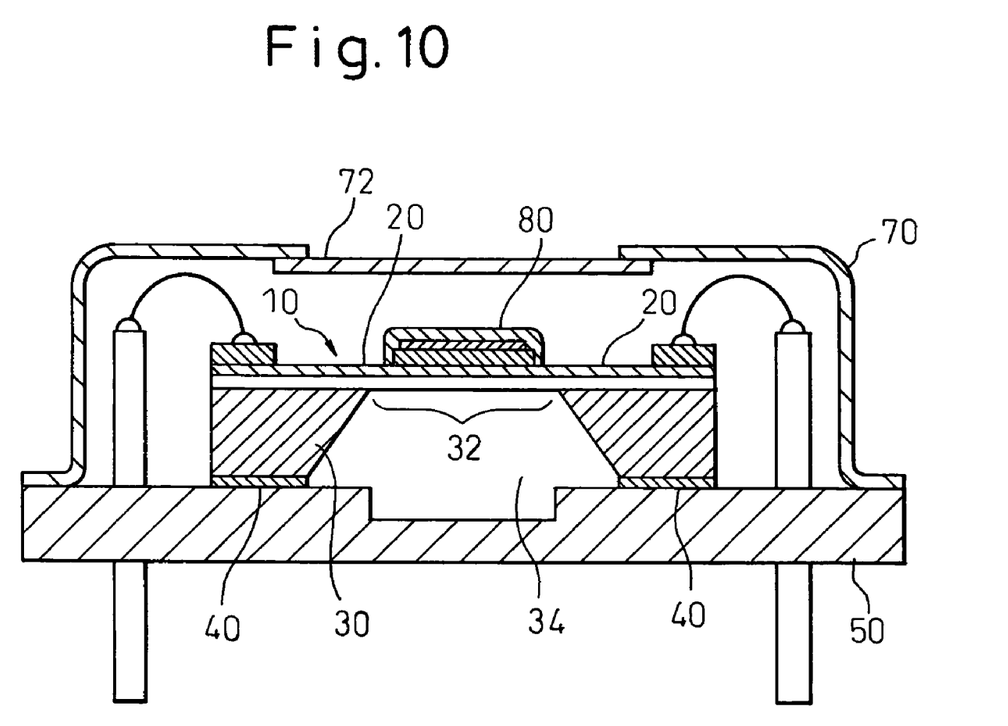
FIG. 10 is a diagram of the conventional semiconductor (No.3) showing a general construction thereof.

Another example method is such one as used in an infrared-ray sensor disclosed in Patent documents 2 and 3, in which the semiconductor sensor 10 is formed as a package and the internal space of the package and the hollow part 34 are put under a vacuum or in a pressure reduced state. FIG. 10 shows a conventional packaged infrared-ray sensor.

As shown in FIG. 10, the infrared-ray sensor 10 has an infrared-ray detecting part 80 formed on a membrane made of a thin film part 32 and an insulating material layer 20. The bottom of a substrate 30 is bonded to a stem 50 with adhesive 40 and a cap 70 having a window part provided with a filter 72 is fixed on the step 50 in a close contact (seal welded) state and thus the infrared-ray sensor 10 is formed as a package. Then, the inside of the cap 70 and the space within a hollow part 34 are put under a vacuum or in a pressure reduced state. By putting the hollow part of a semiconductor sensor 10 and the internal space of the cap 70 excluding the hollow part under a vacuum or in a pressure reduced state, as described above, the change in the difference in gas pressure between the inside and the outside of the semiconductor sensor 10 due to the change in gas temperature within the hollow part 34 can be eliminated or considerably reduced.

However, this method requires that packaging (forming as a package) be carried out in a hermetically sealed container equipped with an evacuation system which has a vacuum means and an exhaust means and, therefore, the process for assembling a sensor becomes complicated and the cost is raised.

SUMMARY OF THE INVENTION

The above-mentioned circumstances being taken into consideration, the object of the present invention is to provide a semiconductor sensor having a membrane structure, capable of preventing the destruction of a membrane, caused by the expansion and/or contraction of a fluid within a hollow part formed under the membrane, while the sensor is in use.

In order to attain the above-mentioned object, a semiconductor sensor according to the present invention comprises a pressure difference adjusting means, for eliminating the difference in fluid pressure between an inside and an outside of a hollow part formed under an membrane structure while the sensor is in use, on a substrate on which the membrane structure is formed. By comprising the pressure difference adjusting means, it is possible to eliminate the difference in fluid pressure between the inside and the outside of the hollow part caused by the change in fluid temperature and to prevent the destruction of the membrane due to the deformation of the membrane caused by the difference in pressure.

The pressure difference adjusting means can be realized by at least one relief hole, provided in the membrane and for the expansion or contraction of a fluid within the hollow part. Through this relief hole, the internal space and the external space of the hollow part are communicated with each other and, therefore, even if the entire circumference of the substrate bottom is bonded to the stem or the like, the difference in pressure between the inside and the outside of the hollow part is eliminated and, as a result, an excessive stress is not produced on the membrane and the distortion of the membrane is not caused to occur. Moreover, due to this, the need of the complicated control of the quantity of adhesive to be applied, as shown in Patent document 1, can be obviated and the mounting process can be prevented from becoming complicated.

Moreover, as there is no need to put the internal space of a package for housing the semiconductor sensor under a vacuum or in a pressure reduced state, the complicated process for assembling a sensor shown in Patent documents 2 and 3 can be eliminated.

The present invention may be more fully understood from the description of the preferred embodiments of the invention set forth below, together with the accompanying drawings.

DESCRIPTION OF THE PREFERRED EMBODIMENTS

Embodiments of the semiconductor sensor of the present invention are explained below with reference to the accompanying drawings.

Figure 1A:
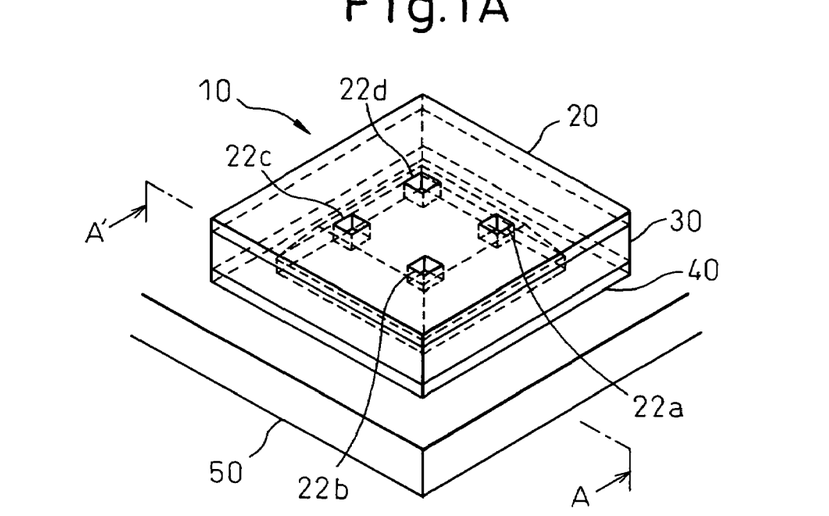
FIG. 1A is a perspective view of a semiconductor sensor (No.1) according to an embodiment of the present invention.
Figure 1B:
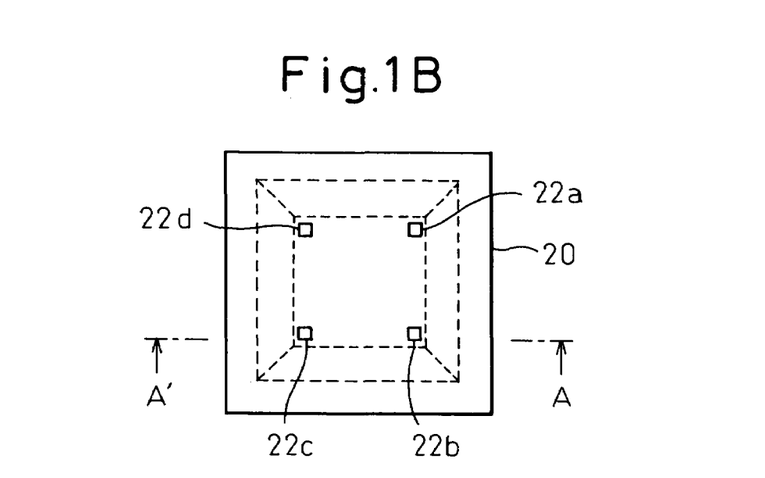
FIG. 1B is a top view of the semiconductor sensor (No.1).
Figure 1C:
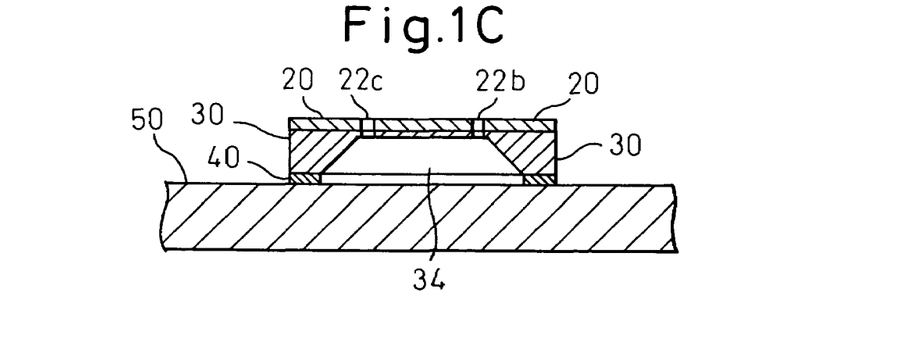
FIG. 1C is a sectional view along the A–A' line in FIG. 1A.

FIG. 1A to FIG. 1C are each a perspective view, a top view and a sectional view along the line A–A' of a semiconductor sensor according to an embodiment of the present invention, respectively. The semiconductor sensor 10 comprises the insulating material layer 20 of a silicon oxide film, a silicon nitride film, etc., and the substrate 30 made of silicon or the like for supporting the insulating material layer 20, and is mounted on a stem 50 by bonding with an adhesive 40. The substrate 30 is provided with a thin film part 32 formed by etching the undersurface in the center of the sensor and a membrane is formed by the thin film part 32 and the insulating material layer 20, as shown in the top view of FIG. 1B and the sectional view of FIG. 1C. On the top surface of the membrane, a detecting element (not shown) for sensing is formed in a stack.

As shown schematically, the semiconductor sensor 10 is provided with relief holes 22a to 22d for the expansion or contraction of a fluid within a hollow part, which penetrate through the thin film part 32 and the insulating material layer 20 in the vicinity of four corners of the membrane and, thereby, the hollow part 34 of the semiconductor sensor 10 and the outside (circumstance) of the semiconductor sensor 10 are communicated with each other.

The relief holes 22a to 22d serve as a pressure difference adjusting means for eliminating the difference in fluid pressure between the inside and the outside of the hollow part 34 while the sensor is in use and, therefore, even if the entire undersurface of the substrate 30 is bonded to the stem 50 as shown schematically, ways of escape are ensured for the fluid present within the hollow part 34 and the difference in gas pressure between the inside and the outside of the semiconductor sensor 10 can be eliminated. Due to this, it is possible to prevent the membrane from being deformed even if the fluid within the hollow part 34 expands or contracts because of a change in fluid temperature.

Figure 2A:
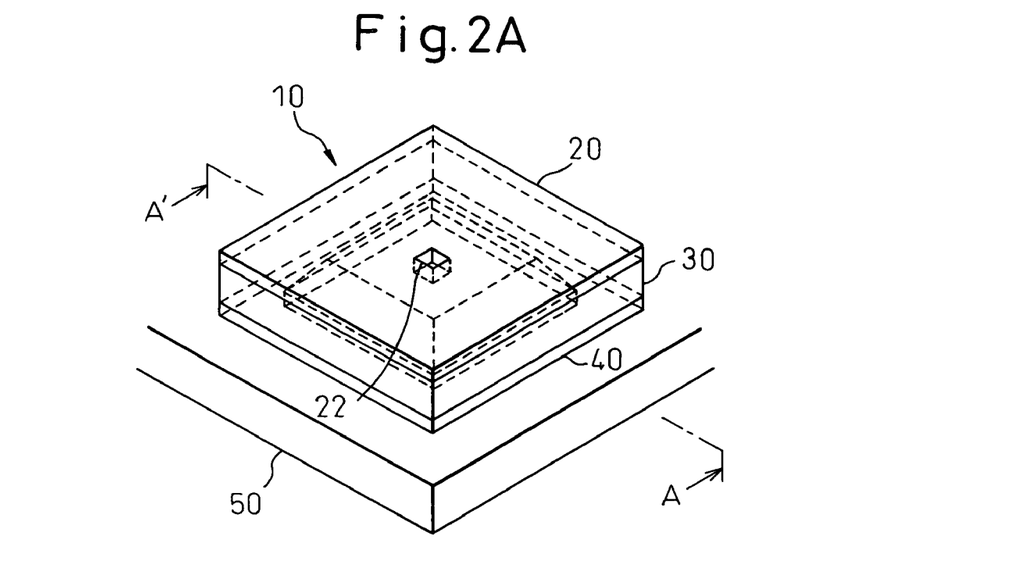
FIG. 2A is a perspective view of a semiconductor sensor (No.2) according to an embodiment of the present invention.
Figure 2B:
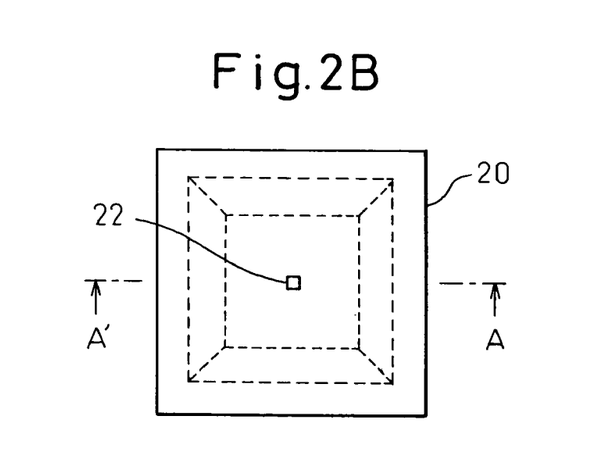
FIG. 2B is a top view of the semiconductor sensor (No.2).
Figure 2C:
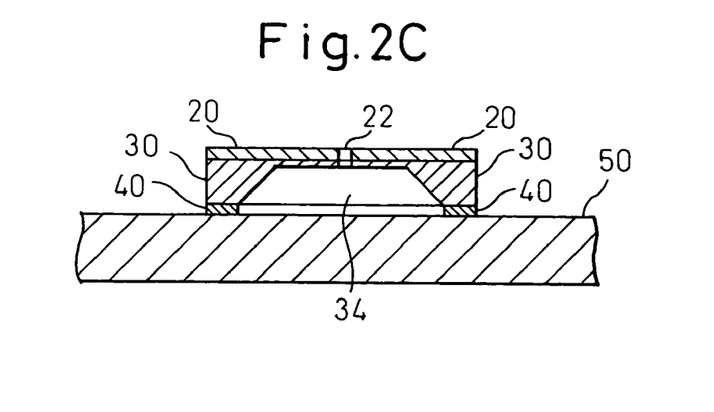
FIG. 2C is a sectional view along the A–A' line in FIG. 2A.

The relief holes 22a to 22d are not necessarily provided at the four corners of the membrane, as shown in FIG. 1A to FIG. 1C, but at least one relief hole may be provided in the membrane. FIG. 2A to FIG. 2C are each a perspective view, a top view and a sectional view along the A–A' line, of a semiconductor sensor provided with one relief hole 22 at the center of the membrane, instead of the four relief holes 22a to 22d in FIG. 1A to FIG. 1C.

The process for providing the relief holes 22 and 22a to 22d for the expansion or contraction of a fluid within the hollow part in the semiconductor sensor 10 is explained below with reference to FIG. 3A to FIG. 3F and FIG. 4. FIG. 3A to FIG. 3F are diagrams showing the process flow chart of a method for manufacturing a semiconductor sensor according to the embodiment of the present invention and FIG. 4 is a flow chart of the method for manufacturing a semiconductor sensor according to the embodiment of the present invention.

Figure 3A:
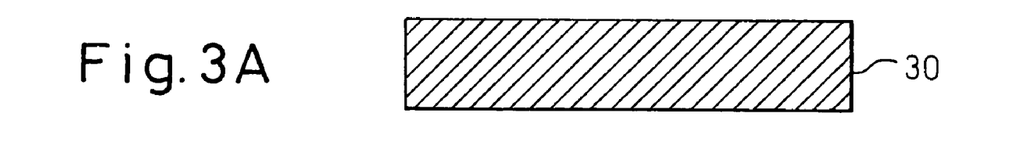
FIG. 3A is a diagram showing one step of a process flow of a method for manufacturing a semiconductor sensor according to an embodiment of the present invention.
Figure 3B:
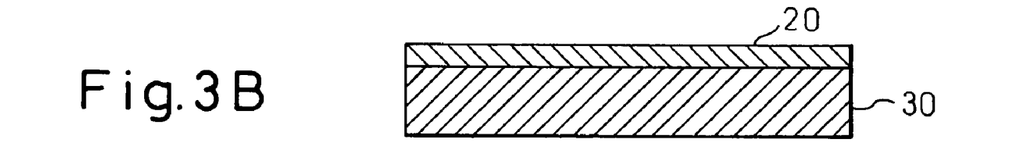
FIG. 3B is a diagram showing another step of a process flow of the method for manufacturing a semiconductor sensor according to an embodiment of the present invention.
Figure 3C:
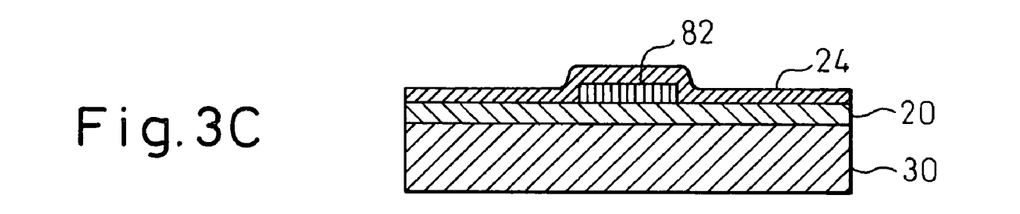
FIG. 3C is a diagram showing another step of a process flow of the method for manufacturing a semiconductor sensor according to an embodiment of the present invention.
Figure 4:
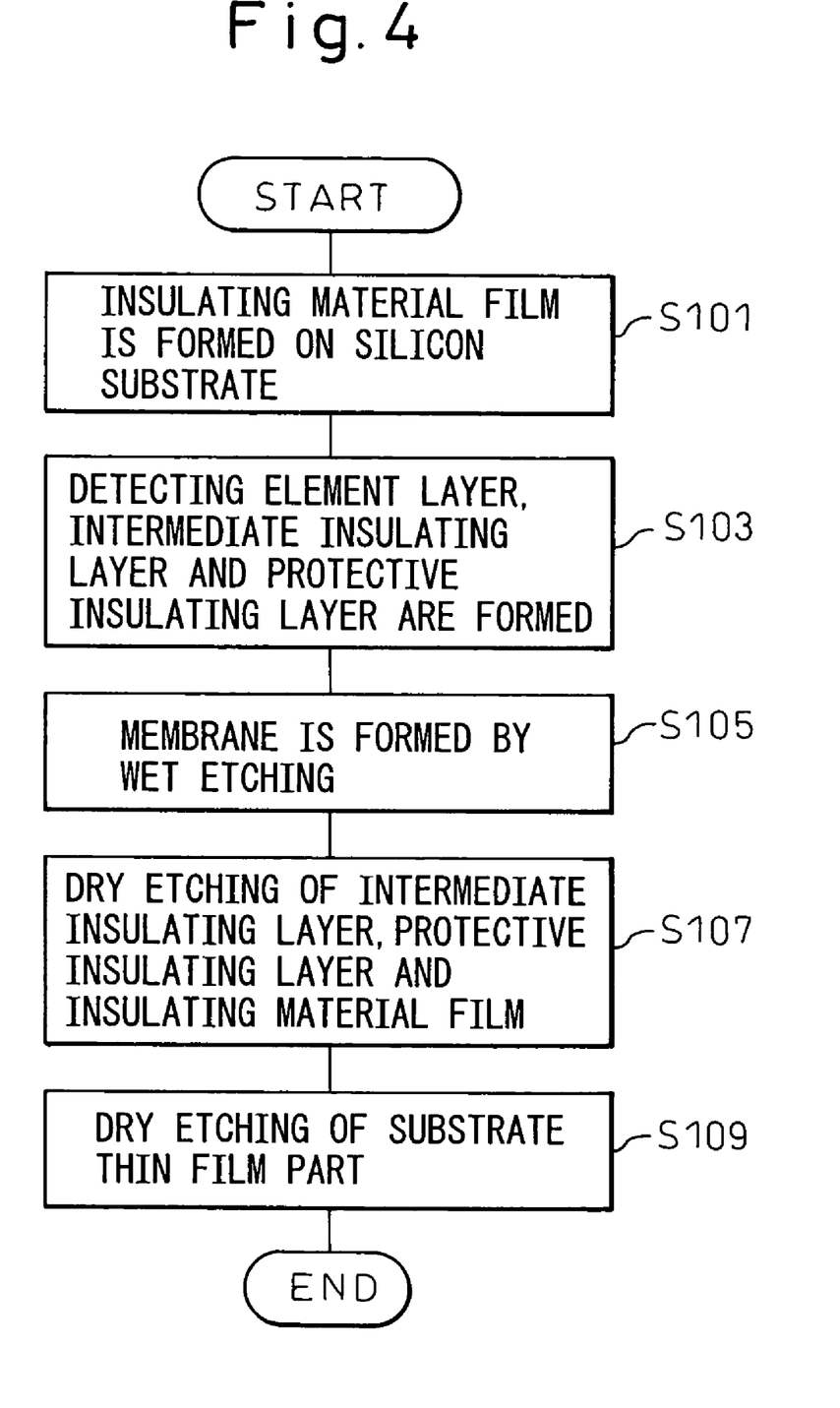
FIG. 4 is a flow chart of a method for manufacturing a semiconductor sensor according to an embodiment of the present invention.

FIG. 3A shows the silicon substrate 30 before the membrane and the relief holes 22 are formed. On the silicon substrate 30, a silicon nitride film and a silicon oxide film forming the insulating material film 20 are formed as a membrane by the CVD (chemical vapor deposition) method or the like (shown in S101 and FIG. 3B). Next, a detecting element layer 82 in accordance with an object to be detected by each kind of sensors and an insulating layer 24, such as an intermediate insulating layer and a protective insulating layer, are formed as membranes by the CVD method or the like and are stacked after pattern formation by a photo lithograph method or the like (shown in S103 and FIG. 3C).

Figure 3D:
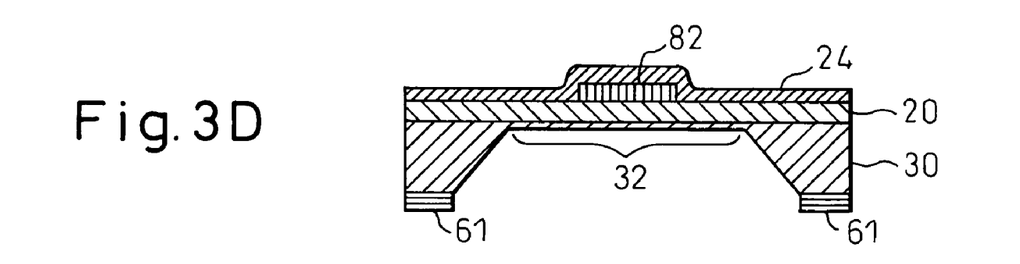
FIG. 3D is a diagram showing another step of a process flow of the method for manufacturing a semiconductor sensor according to an embodiment of the present invention.
Figure 3E:
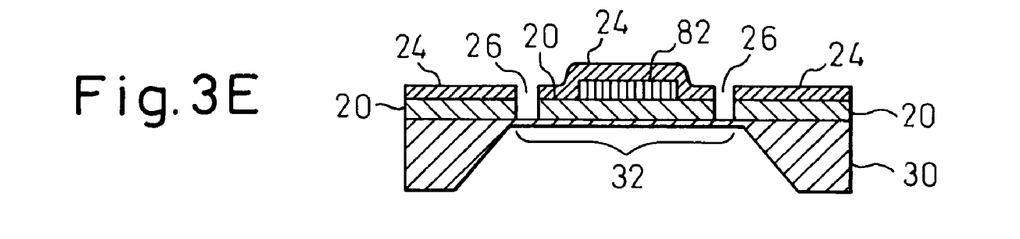
FIG. 3E is a diagram showing another step of a process flow of the method for manufacturing a semiconductor sensor according to an embodiment of the present invention.
Figure 3F:
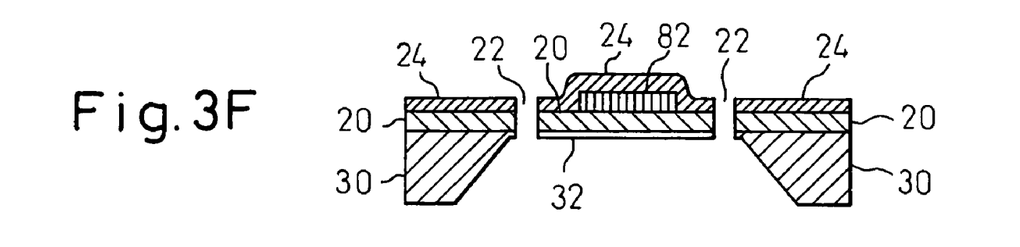
FIG. 3F is a diagram showing another step of a process flow of the method for manufacturing a semiconductor sensor according to an embodiment of the present invention.

Then, an etching mask 61 such as a silicon nitride film is formed as a membrane on the bottom of the substrate 30, the thin film part 32 of the substrate is formed by wet etching, and thus the membrane is formed (shown in S105 and FIG. 3D). After this, openings 26 are provided in the positions, in which the relief holes 22 for the expansion or contraction of a fluid within the hollow part are provided, by dry-etching the insulating material film 20 and the insulating layer 24 made of an intermediate insulating layer and a protective insulating layer by using the RIE (reactive ion etching) method or the like (shown in S107 and FIG. 3E). Finally, dry etching of the thin film part 32 of the silicon substrate is carried out by using the insulating material film 20 made of a silicon oxide film and a silicon nitride film and the insulating layer as a mask and, thus, the relief holes 22 for the expansion or contraction of a fluid within the hollow part 34 are provided (shown in S109 and FIG. 3F).

In the manner described above, it is possible to provide the relief holes 22 for the expansion or contraction of a fluid within the hollow part in the semiconductor sensor 10.

While the invention has been described by reference to specific embodiments chosen for the purposes of illustration, it should be apparent that numerous modifications could be made thereto, by those skilled in the art, without departing from the basic concept and scope of the invention.

The invention claimed is:

1. A semiconductor sensor comprising:
   a substrate;
   a membrane which is a thin part formed on a top surface of the substrate; and
   a thick portion which is formed in a portion excluding the thin portion from the substrate; wherein
   a hollow part is formed under the membrane by bonding a bottom of the substrate and a mounting surface on which the semiconductor sensor is mounted;
   a pressure difference adjusting means is provided for eliminating difference in pressure of a fluid between an inside and an outside of the hollow part while the sensor is in use; and
   the pressure difference adjusting means is at least a relief hole, provided on the membrane, for the expansion or contraction of a fluid within the hollow part, only the at least a relief hole communicating the hollow part to an outside of the semiconductor sensor.

2. A semiconductor sensor, as set forth in claim 1, wherein the membrane is provided with the at least a relief hole for the expansion or contraction.

3. A semiconductor sensor, as set forth in claim 1, wherein the at least a relief hole for the expansion or contraction is provided by etching the membrane.

4. A semiconductor sensor, as set forth in claim 1, wherein it is any one of an infrared-ray sensor, a gas sensor, an air fuel ratio sensor, a pressure sensor and an acceleration sensor.

5. A semiconductor sensor, as set forth in claim 1, wherein the hollow part formed under the membrane is substantially enclosed by the mounting surface.

6. A semiconductor sensor, as set forth in claim 1, wherein there is provided one relief hole.

7. A semiconductor sensor, as set forth in claim 1, wherein there are provided four relief holes.

8. A semiconductor sensor, as set forth in claim 7, the relief holes being provided at respective corners of the membrane.

9. A semiconductor sensor, as set forth in claim 1, wherein the entire undersurface of the substrate is bonded to the mounting surface to enclose the hollow part.

10. A semiconductor sensor, as set forth in claim 1, wherein there is provided one relief hole.

11. A semiconductor sensor, as set forth in claim 1, wherein there are provided four relief holes.

12. A semiconductor sensor, as set forth in claim 11, the relief holes being provided at respective corners of the membrane.

13. A semiconductor sensor comprising:
- a substrate;
- a membrane which is a thin part formed on a top surface of the substrate; and
- a thick portion which is formed in a portion excluding the thin portion from the substrate; wherein
- a hollow part is formed under the membrane by bonding a bottom of the substrate and a mounting surface on which the semiconductor sensor is mounted, the entire undersurface of the substrate being bonded to the mounting surface to enclose the hollow part;
- at least a relief hole is provided on the membrane for eliminating difference in pressure of a fluid between an inside and an outside of the hollow part while the sensor is in use, the at least a relief hole being provided on the membrane, for the expansion or contraction of a fluid within the hollow part, only the at least a relief hole communicating the hollow part to an outside of the semiconductor sensor,
- wherein the semiconductor sensor is any one of an infrared-ray sensor, a gas sensor, an air fuel ratio sensor, a pressure sensor and an acceleration sensor.

* * * * *